United States Patent [19]
Sung

[11] Patent Number: 6,057,197
[45] Date of Patent: *May 2, 2000

[54] ISOLATION SCHEME TO PREVENT FIELD OXIDE EDGE FROM OXIDE LOSS

[75] Inventor: Kuo-Tung Sung, Hsinchu, Taiwan

[73] Assignee: Mosel Vitelic, Inc., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/082,130

[22] Filed: May 20, 1998

[51] Int. Cl.[7] ........................ H01L 21/336; H01L 21/265

[52] U.S. Cl. ......................... 438/296; 438/297; 438/298; 438/262

[58] Field of Search .................................. 438/296–298, 438/257, 262, 424

[56] References Cited

U.S. PATENT DOCUMENTS

| | | | |
|---|---|---|---|
| 5,576,230 | 11/1996 | Guldi | 438/298 |
| 5,717,086 | 2/1998 | Kim et al. | 438/443 |
| 5,756,390 | 5/1998 | Juengling et al. | 438/439 |
| 5,763,309 | 6/1998 | Chang | 438/262 |
| 5,793,089 | 8/1998 | Fulford et al. | 257/408 |

*Primary Examiner*—Chandra Chaudhari
*Assistant Examiner*—David S. Blum
*Attorney, Agent, or Firm*—Townsend and Townsend and Crew LLP

[57] ABSTRACT

A semiconductor integrated circuit such as a flash memory device with a novel isolation structure. Field isolation (130) is defined on a substrate (10). A spacer (107) is formed at the edges of the field isolation to protect the field isolation from oxide loss during subsequent processing steps, such as HF dips to remove polysilicon or polymer stringers that are often a part of a flash EEPROM process, for example.

14 Claims, 5 Drawing Sheets

ISOLATION SCHEME TO PREVENT FIELD OXIDE EDGE FROM OXIDE LOSS

BACKGROUND OF THE INVENTION

The present invention relates to integrated circuits ("ICs") fabricated on semiconductor wafers and more particularly to electrically isolating adjacent devices of ICs from each other.

Integrated circuits have evolved from a handful of interconnected devices fabricated on a single chip of silicon to millions of devices. Current ICs provide performance and complexity far beyond what was originally imagined. In order to achieve the improvements in complexity and circuit density, i.e., the number of devices capable of being packed onto a given chip area, the size of the smallest device feature, also known as the device "geometry", has gotten smaller with each generation of ICs. Currently, devices are being fabricated with features less than a quarter of a micron across.

Increasing circuit density has not only improved the complexity and performance of ICs, but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility.

Shrinking device geometries have presented several issues to address. For example, devices on an IC are typically electrically isolated from each other. A variety of methods have evolved to accomplish this. Early bipolar ICs used depletion-region isolation between devices. These methods rely on essentially forming a reverse-biased isolation alley, or well, around each device or cell of the IC. A depletion-region isolation technique must allow for a large inactive area of the silicon surface between adjacent devices, which adversely affects IC packing densities. The consumption of chip area using this isolation technique became more pronounced as device geometries shrank and the area required for device isolation became a larger fraction of the total IC area.

Metal-oxide-semiconductor ("MOS") devices do not require the same type of isolating structure as bipolar devices, and ICs having the highest component densities are fabricated with MOS technologies. On way of isolating two adjacent MOS devices is with the local oxidation of silicon ("LOCOS") method. The LOCOS method relies on a relatively thick field oxide to be formed between devices. This thick field oxide reduces the chance that a conductive trace laying over the oxide will act as the gate of a parasitic transistor, linking one cell to another.

Figure 1A:
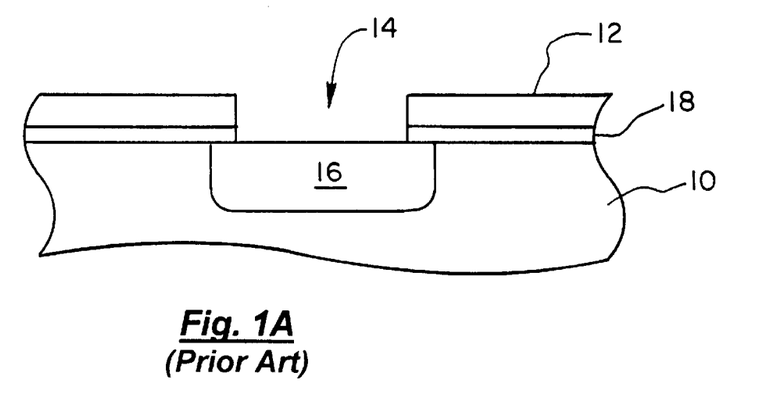
FIGS. 1A–1C are simplified cross sections of a wafer being processed to form a LOCOS-type of isolation structure.
Figure 1B:
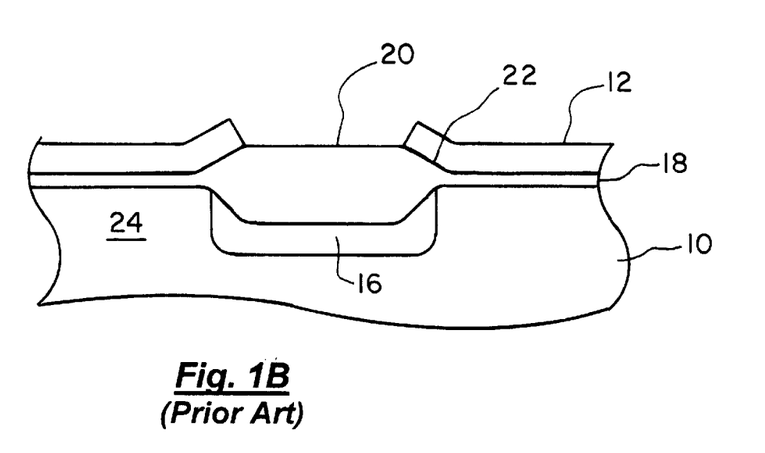
Figure 1C:
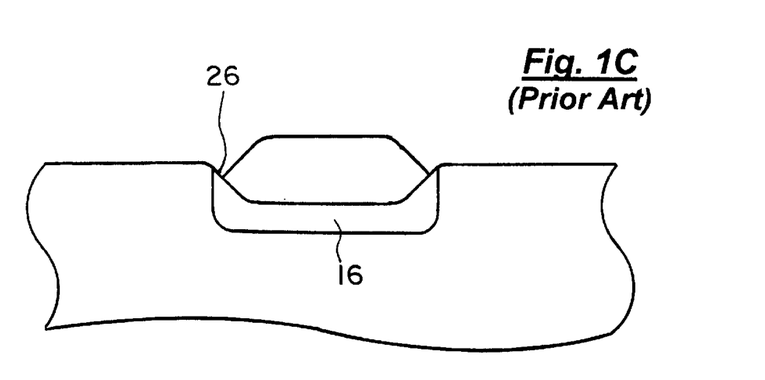

FIGS. 1A–1C show simplified cross sections of a silicon wafer during a LOCOS process. FIG. IA shows a silicon wafer 10 with an oxidation mask layer 12 that has been patterned to form a window 14 that exposes the silicon. The oxidation mask is typically made of silicon nitride that has been formed by a chemical vapor deposition ("CVD") process. Ions may be implanted through the window 14 into the silicon wafer to form an isolation well 16. Oxygen and water vapor diffuse very slowly through the silicon nitride layer, compared to their rate of diffusion through silicon dioxide. A pad layer 18 of silicon dioxide is frequently grown on the silicon wafer using thermal oxidation means to cushion the surface stress between the oxidation mask 12 and the silicon wafer 10.

FIG. 1B shows the wafer after the field oxide growth step. A field oxide 20 is thermally grown, usually by a wet oxidation (steam) method. About 45% of the thermal field oxide growth is downward, and 55% is upward, the resulting layer of silicon oxide being thicker than the silicon it consumes. The oxidation mask layer 12 effectively prevents oxide from growing beneath it, although lateral diffusion of oxygen and steam, including diffusion along the pad layer 18 causes oxide to grow under the oxidation mask layer 12. The wedge 22 of field oxide that grows underneath the oxidation mask has been named a "bird's beak" because of its characteristic shape. The bird's beak is a lateral extension of the field oxide 20 into the active area 24 of a device.

FIG. IC shows the wafer after the oxidation mask and pad oxide layers have been stripped. Stripping the pad oxide typically etches away part of the bird's beak oxide, and may expose a portion 26 of the isolation well 16. Subsequent processing, such as a nitric-hydrofluoric acid dip to remove stringers, such as polysilicon or polymer stringers, following a polysilicon deposition and patterning process, may remove additional amounts of the bird's beak and further expose the isolation well.

The exposed portion of the isolation edge can cause at least two problems. First, the decrease in isolation width decreases the isolation between adjacent devices. Second, the gate oxide or tunnel oxide thickness at the exposed portion of the isolation edge is thinner than elsewhere, which may cause earlier breakdown. Therefore, it is desirable to provide an isolation structure that is not as susceptible to oxide loss at the edge of the field oxide due to subsequent processing. It would be further desirable to easily adapt existing manufacturing processes to produce the desired isolation structure.

From the above, it is seem that an improved isolation structure for an integrated circuit device is highly desirable.

SUMMARY OF THE INVENTION

The present invention provides a technique, including a method and apparatus, to electrically and physically isolate adjacent device cells in an integrated circuit, such as an electronic memory device, e.g., flash memory.

In an exemplary embodiment, the present invention provides a method and resulting structure for an improved isolation structure for a semiconductor integrated circuit. The method includes a step of providing a substrate, such as a wafer or the like. A field isolation structure is defined on the substrate. As merely an example, a technique commonly termed local oxidation of silicon or LOCOS can be used for forming the isolation structure. Other techniques can also be used. A spacer is formed adjacent to edges of the field isolation structure or insulating structure and over an edge of an insulating layer, which can be a gate oxide layer or the like. The spacer protects edges of the isolation structure during subsequent processing of films overlying active regions of the substrate. The spacer can be made of a variety of materials such as silicon nitride, high density silicon dioxide, and others. Silicon nitride is preferred.

These and other embodiments of the present invention, as well as its advantages and features are described in more detail in conjunction with the text below and attached figures.

DESCRIPTION OF THE SPECIFIC EMBODIMENTS

Figure 2:
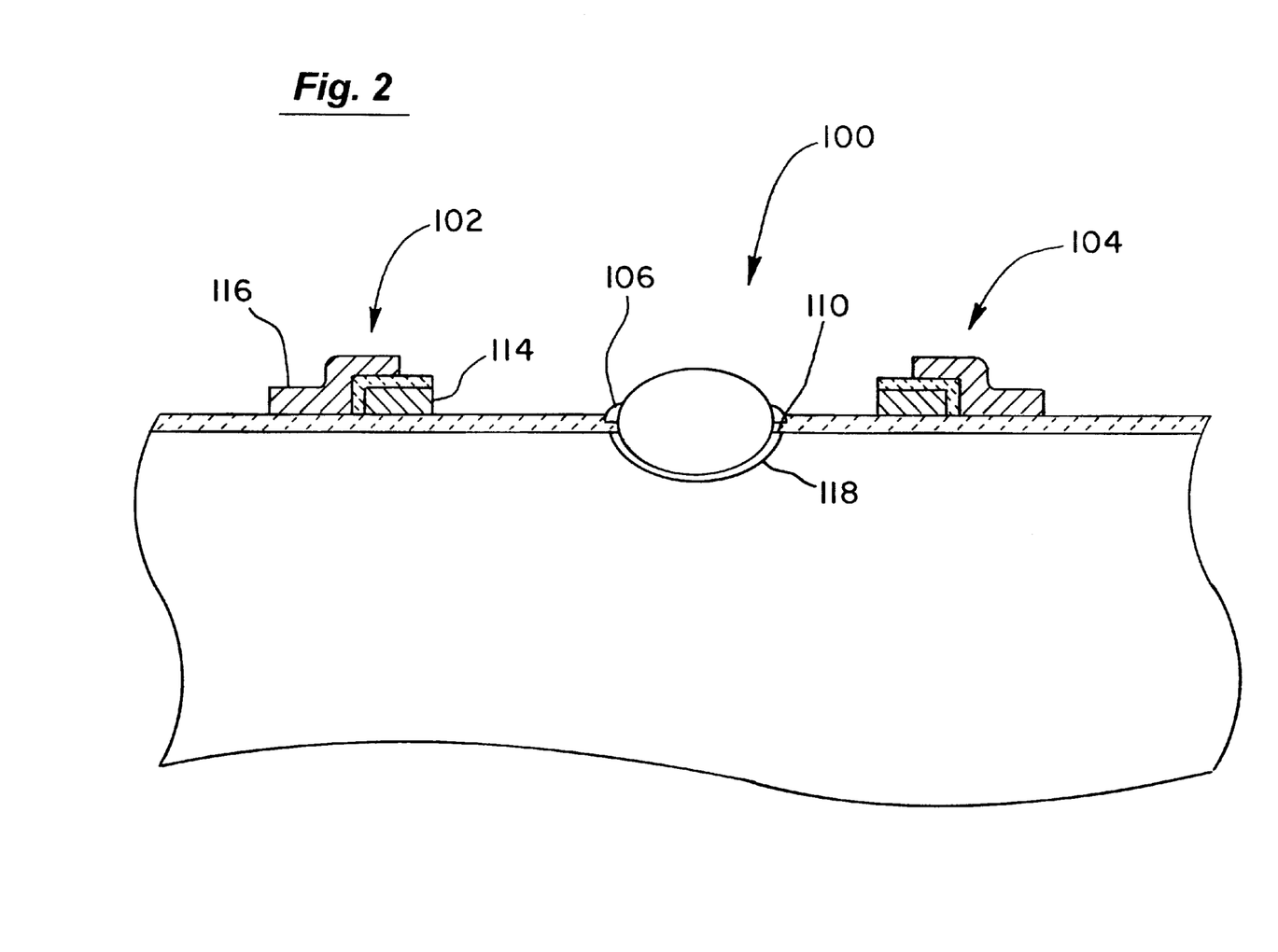
FIG. 2 is a simplified cross section of an isolation structure according to the present invention separating two cells of an EEPROM device.

FIG. 2 is a simplified cross section of a portion of an integrated circuit. This circuit is a simplified example and should not limit the scope of the claims. One of ordinary skill in the art would recognize other variations, modifications, and alternatives. An isolation structure 100 is placed between two cells 102, 104 of a flash electronically erasable, programmable, read only memory ("flash EEPROM") device, although such a device is used for purposes of illustration only. The isolation structure utilizes a silicon nitride spacer 106 to protect the edges 110 of the isolation sidewall 118 from becoming exposed during subsequent processing of the device. Such protection is particularly relevant for use with flash EEPROM type circuits because of the multiple layers of polysilicon that are deposited and patterned on such devices. A flash EEPROM often has a floating gate 114 and another gate, such as a control gate 116, both of which may be made of polysilicon.

When polysilicon is patterned, stringers often form that adversely affect the operation or reliability of the device, particularly during a polysilicon etch process that provides precise control over the critical dimension of the pattern. The wafers are often dipped in a wet etch solution that contains hydrofluoric acid to dissolve the stringers. However, these dips also attack oxides, such as the oxide layer covering the edge of the isolation region. As discussed above, the removal of the oxide layer covering the isolation region lowers the isolation between adjacent cells. This problem is particularly acute with EEPROM circuits for at least two reasons.

First, the presence of multiple layers of polysilicon (used for the various gates in an EEPROM device) typically require multiple dips as part of the patterning process for each polysilicon layer, thus removing more isolation oxide than would be removed in processes with fewer polysilicon layers. Second, EEPROMs typically operate at two voltages. A lower voltage is used to sense, or read, the state of a floating gate, and is usually in the 1.5–5 V range typical of many memory circuits. A higher voltage is used to program the state of the floating gate. The higher voltage is typically about twice as high as the lower voltage, and the isolation between cells must be able to withstand this higher voltage.

Figure 3A:
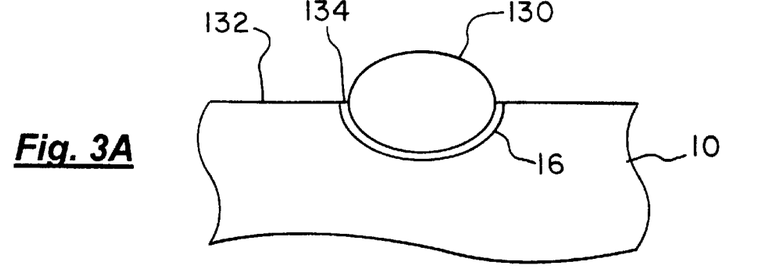
FIGS. 3A–3D are simplified cross sections of a wafer being processed to form an improved isolation structure according to one embodiment of the present invention.

FIG. 3A is a simplified cross section of a standard LOCOS or modified LOCOS isolation structure. LOCOS oxide 130 has been formed on a silicon wafer 10. Oxide has been stripped from the field 132 of the wafer, leaving bare silicon exposed in the field of the wafer and the edge 134 of the isolation region 16. The basic LOCOS process can be modified by recessing the LOCOS oxide by etching a trench in the silicon substrate prior to the LOCOS oxide formation, so that the LOCOS oxide is more planar with the rest of the wafer, or the LOCOS process may be modified in other ways.

Figure 3B:
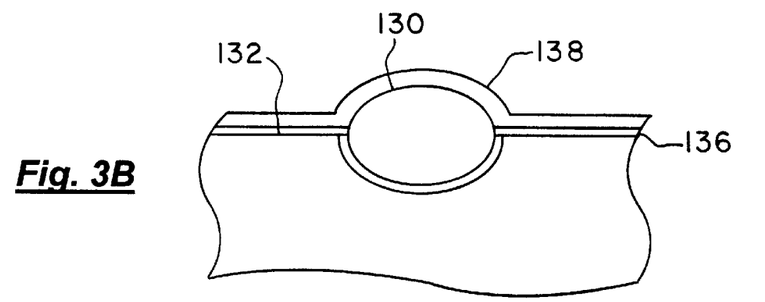

FIG. 3B is a simplified cross section of the LOCOS structure shown in FIG. 3A with a thin layer of oxide 136, approximately 50 Å, formed on the field 132 of the wafer. This thin layer of oxide will be used as an etch stop layer in a subsequent process step, but can also form a portion of a gate dielectric or tunneling dielectric layer in a FET or EEPROM- type circuit. In the event that the thin oxide layer will be used in a tunneling dielectric layer or gate dielectric layer, the thin oxide layer should be a high-quality film. Such a film can be formed by thermal oxidation of the silicon wafer, as in a steam oxidation process, or can be formed by CVD or other methods. A layer of silicon nitride or silicon oxy-nitride 138 is formed over the thin oxide layer 136 and the LOCOS oxide 130. The silicon nitride layer is formed using a CVD process to be approximately 100 Å thick. The process forms a conformal silicon nitride layer over the surface of the substrate.

Figure 3C:
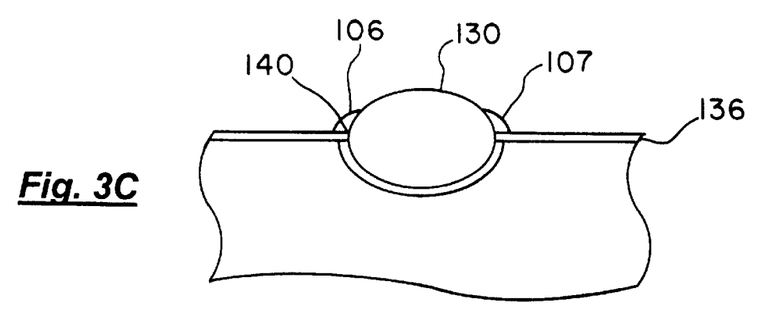

FIG. 3C is a simplified cross section of the structure shown in FIG. 3B after a selective anisotropic etch has been performed. The anisotropic etch would be, for example, a biased plasma etch in which etchant species in the plasma are moved to and from the surface of a process wafer by an alternating electric field. The plasma is formed from carbon tetrafluoride ($CF_4$) or hexafluoroethane ($C_2F_6$) or other precursors. The plasma efficiently removes silicon nitride material, while removing the oxide materials at a lower rate, thus selectively removing the silicon nitride and leaving the oxides. Vertical portions of the silicon nitride layer, such as the portions on the walls of the LOCOS oxide, have a greater effective thickness, that is the vertical distance between the etch stop layer and the plasma is greater in these regions, and therefore silicon nitride remains in these areas after the silicon nitride has been etched from the field. This etch process leaves silicon nitride spacers 106, 107 covering the corner 140 between the LOCOS oxide 130 and the thin oxide layer 136.

Figure 3D:
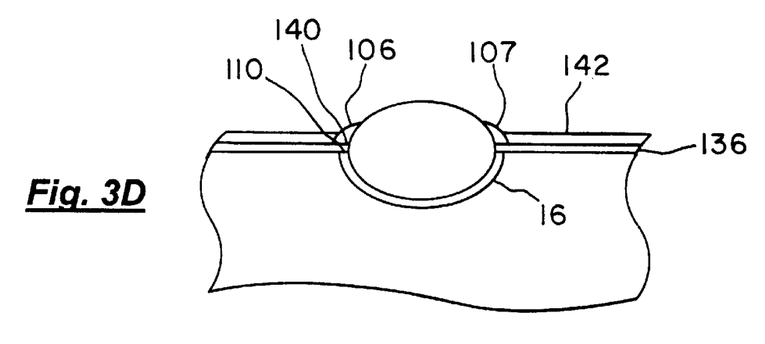

FIG. 3D is a simplified cross section of a structure of an embodiment in which a sacrificial oxide layer 142 has been formed over the thin oxide layer 136. The sacrificial oxide layer, which is approximately 250 Å thick, but could be thinner or thicker depending upon the amount of oxide that is anticipated to be removed from the field in the subsequent processing steps, particularly dips to remove stringers. For example, a double polysilicon process could use a thinner sacrificial oxide layer than a triple polysilicon process. This layer is a sacrificial layer because it is intended that most or all of it will be sacrificed in subsequent polysilicon dip processes. However, even if the entire sacrificial layer is removed, the edge 110 of the isolation region 16 remains covered by the thin oxide layer 136, which is protected from the polysilicon dip processes by the silicon nitride spacers 106, 107. Furthermore, no thinning of the thin oxide layer occurs at the edge 110 of the isolation region 16; therefore, superior isolation is maintained. The total field oxide thickness at this point is approximately 300 Å. Conventional processes may be used from this point on. The silicon nitride spacers may be left in the device structure, or may be removed at a later point in the process.

Figure 4:
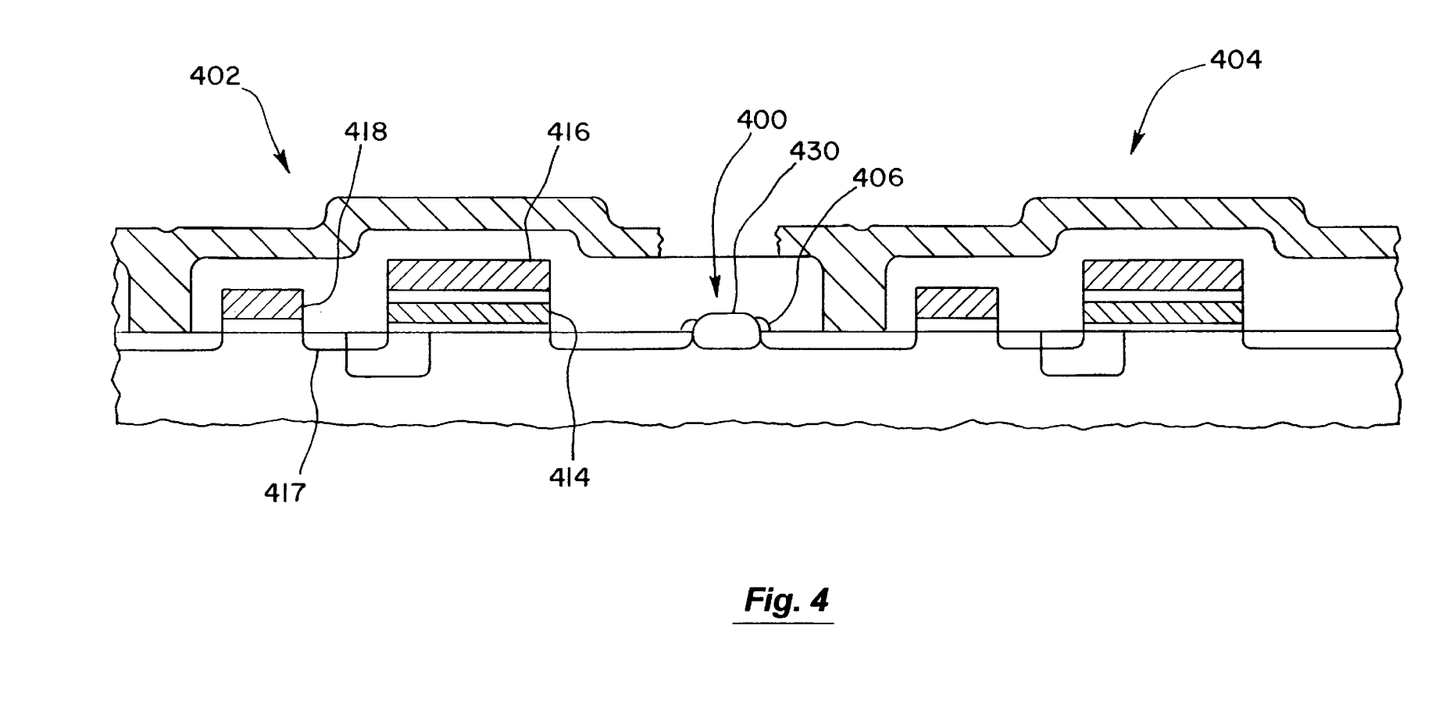
FIG. 4 is a simplified cross section of a memory device according to an embodiment of the present invention.

FIG. 4 is a simplified cross section diagram of the present invention incorporated into a memory device. The memory device is a flash memory type, with a first cell 402 and a second cell 404 separated by an isolation structure 400. A memory cell includes a floating gate 414, a control gate 416, and a select gate 418. The floating gate 414 and control gate 416 form a memory cell. The memory cell is connected in series to a field-effect transistor formed by the sense gate 418 by an implanted region 417. The isolation structure 400 includes a LOCOS oxide 430 with nitride spacers 406 that protect the edges of the isolation region during device processing.

Figure 5:
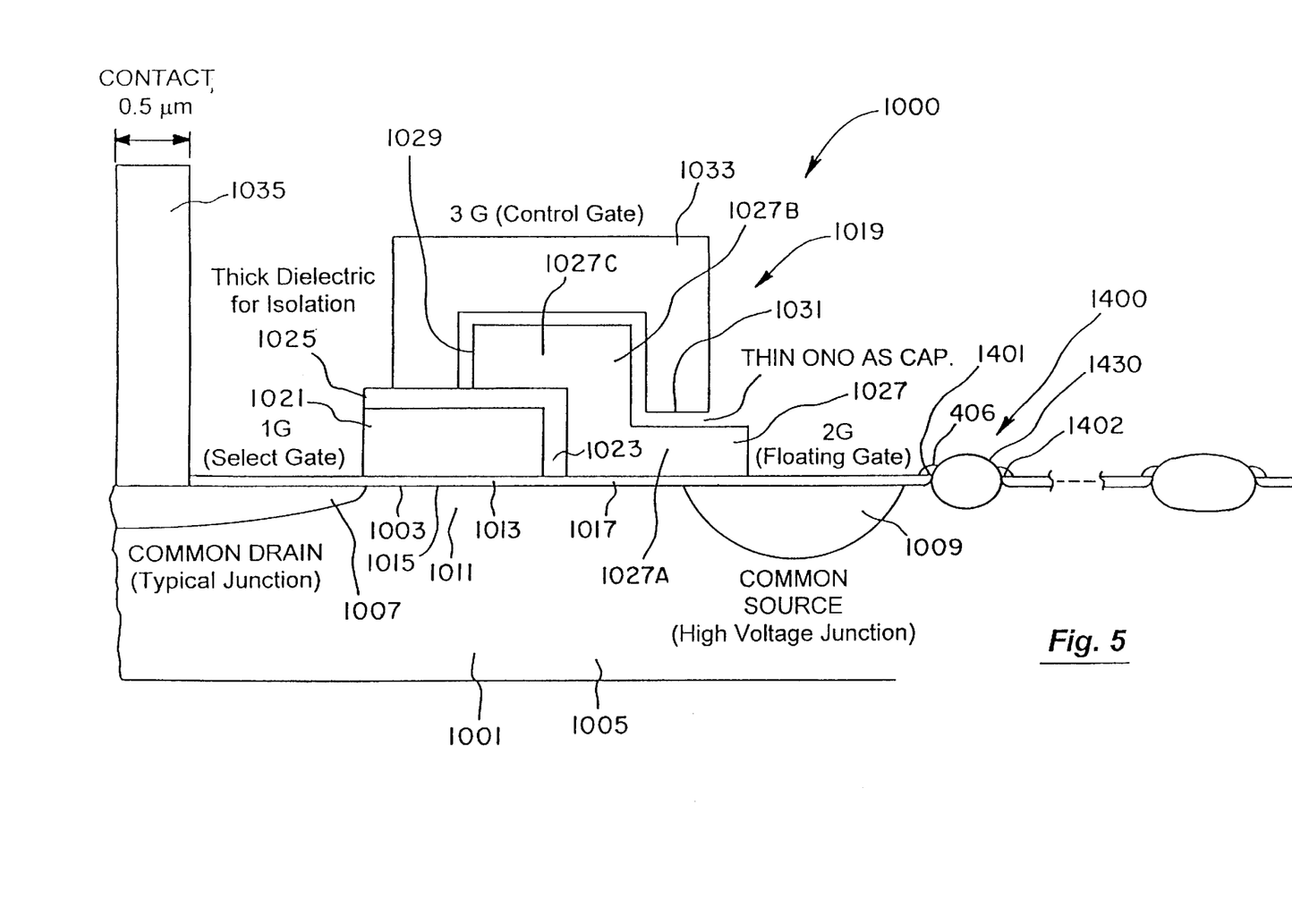
FIG. 5 is a simplified cross section of another memory device according to another embodiment of the present.

FIG. 5 illustrates how the present invention can be applied to an improved flash memory cell 1000. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a POCl$_3$ compound or the like. Alternatively, the gate can be in-situ doped using a phosphorous bearing compound or the like. In further embodiments, the polysilicon layer can be laid in an amorphous state, which is later crystallized. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g., a control gate 1033 or a floating gate 1027. The select gate also has a channel region ranging from about 0.2 microns and less or about 1.0 microns and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge 1029 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a POCl$_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a POCl$_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region (not shown). These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices ranges from about 0.4 micron to 0.25 micron and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

An isolation structure 1400 separates memory cell 1000 from a second memory cell (not shown). The isolation structure 1400 includes a LOCOS oxide 1430 with nitride spacers 1406 that protect the edges 1401, 1402 of the isolation structure during device processing.

While the above is a complete description of specific embodiments of the present invention, various modifications, variations, and alternatives may be employed. For example, the present invention may be applied to other isolation techniques, such as a shallow trench isolation technique, other types of wafers, such as silicon-on-insulator wafers, or other types of devices, such as other MOS devices. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A method for forming an isolation structure on a substrate for an integrated circuit device, the method comprising steps, in order, of:

(a) forming an isolation region in a portion of the substrate by providing dopant species to the portion of the substrate;

(b) forming an insulating structure on a surface of the substrate over at least a portion of the isolation region, the insulating structure having a wall;

(c) forming a spacer of a first material adjoining the wall of the insulating structure; and (d) thereafter forming a gate adjacent said isolation region.

2. The method of claim 1 wherein the integrated circuit device is a flash EEPROM device, the insulating structure being disposed between a first cell having said gate and a second cell of the flash EEPROM device.

3. The method of claim 1 further including a step, after the step (b), of forming a thin dielectric layer of a second material over a field of the substrate and over an edge portion of the isolation region, the thin dielectric layer abutting the wall of the insulating structure at a juncture.

4. The method of claim 3 wherein the spacer lies above the edge portion of the isolation region to at least partially cover the juncture.

5. The method of claim 3 further including a step, following the step (c), of forming a sacrificial oxide layer over the thin dielectric layer, the sacrificial oxide layer being set back from the wall of the insulating structure by the spacer.

6. The method of claim 5 further including a step of removing the spacer after formation of the sacrificial oxide layer.

7. The method of claim 1 wherein the insulating structure is formed by locally oxidizing said portion of the isolation region.

8. The method of claim 3 wherein said gate is formed over said thin dielectric layer.

9. The method of claim 1 wherein said forming said gate comprises dipping said substrate in a wet etched solution, said spacers protecting a corner of said insulating structure from said solution.

10. A method for forming an isolation structure on a substrate for an integrated circuit device, the method comprising steps, in order, of:

(a) forming an isolation region in a portion of the substrate by implanting dopant species into the portion of the substrate;

(b) forming an insulating structure on a surface of the substrate by growing oxide over at least a portion of the isolation region, the insulating structure having a wall;

(c) forming a spacer of silicon nitride overlying a juncture between the isolation region and the substrate and adjoining the wall of the insulating structure;

(d) forming a sacrificial oxide layer over a field of the substrate, the sacrificial oxide layer being set back from the wall of the insulating structure by the spacer; and (e) thereafter forming first and second active areas on said substrate separated by said isolation region.

11. The method of claim 10 wherein said forming said first and second active areas comprises dipping said substrate in a wet etched solution, said spacers protecting a corner of said insulating structure from said solution.

12. A method for forming an isolation structure on a substrate for an integrated circuit memory device, the method comprising steps, in order, of:

(a) ion implanting an isolation region in a portion of the substrate, the portion of the substrate being between a first memory cell region and a second memory cell region of the integrated circuit memory device;

(b) locally growing an oxide insulating structure on a portion of the isolation region, the oxide insulating structure having a wall;

(c) forming a spacer of a first dielectric material, the spacer overlying a juncture between the isolation region and the substrate; and (d) thereafter forming a gate in an active region adjacent said isolation structure.

13. The method of claim 12 further comprising a step, prior to the step (c), of forming a dielectric layer of a second dielectric material between about 50–200 Å thick on the substrate and on a second portion of the isolation region to adjoin the insulating structure.

14. The method of claim 12 further comprising a step, after the step (c), of forming a dielectric layer of a second dielectric material between about 50–200 Å thick on the substrate and adjoining the spacer.

* * * * *